United States Patent [19]

Pellegrino

[11] 4,034,283

[45] July 5, 1977

[54] COMPENSATED VOLTAGE DIVIDER

[75] Inventor: Anthony Pellegrino, Brewster, N.Y.

[73] Assignee: The Machlett Laboratories, Incorporated, Stamford, Conn.

[22] Filed: Aug. 28, 1975

[21] Appl. No.: 608,495

[52] U.S. Cl. .............................. 323/74; 324/126; 338/60; 338/64

[51] Int. Cl.² .......................................... G01T 1/26

[58] Field of Search ............ 323/74, 81, 93, 94 R; 324/126; 338/60, 64

[56]  References Cited

UNITED STATES PATENTS 2,793,256  5/1957  Taieb ............................... 338/60 X

OTHER PUBLICATIONS

Henkel et al., "Stabilized High Voltage Power Supply for Electrostatic Analyzer," The Review of Scientific Instruments, vol. 20, No. 10, Oct. 1949, pp. 729–731.

Primary Examiner—A. D. Pellinen
Attorney, Agent, or Firm—John T. Meaney; Joseph D. Pannone; Harold A. Murphy

[57] ABSTRACT

A voltage divider comprising a coaxial array of spaced parallel, capacitive plates connected to one another by respective resistive elements disposed between the plates.

10 Claims, 4 Drawing Figures

COMPENSATED VOLTAGE DIVIDER

BACKGROUND OF THE INVENTION

This invention relates generally to voltage monitoring apparatus and is concerned more particularly with a voltage sensing network having frequency compensating means.

In the operation of a conventional X-ray tube, for example, high magnitude voltages relative to electrical ground are applied to the cathode and anode electrodes in order to establish a strong electrostatic field therebetween. As a result, electrons emitted from the cathode are beamed electrostatically onto a small focal spot area of the anode with sufficient energy to generate an X-ray beam which emanates from the tube. Accordingly, the respective values of the voltages applied to the cathode and anode electrodes of the tube are directly related to the energy of the X-radiation thus generated.

It is well known that an X-ray beam may be passed through a selected portion of a patient for a short interval of time to obtain a shadow image of the internal body structure. Consequently, in order to ascertain the energy of X-radiation to which the patient is exposed, it is necessary to determine accurately the respective potentials of the cathode and anode electrodes during the exposure interval. Generally the peak voltage applied to the anode during the exposure pulse interval is provided by a peak reading voltmeter connected across a load resistive element in the external cathode-to-anode circuit. However, a peak reading voltmeter does not include means for evaluating the output voltage pulse waveform or for detecting voltage transients which could provide information concerning defects in the tube or in the external circuitry.

The output voltage waveform may be studied by connecting an oscilloscope across a portion of a voltage divider which is connected externally between the cathode and anode of the X-ray tube. However, if the resistive value of the voltage divider element is too low, overheating results. On the other hand, if the resistive value of the voltage divider element is too high, high frequency transients are not disclosed due to the effects of stray capacitance.

Therefore, it is advantageous and desirable to provide a voltage monitoring apparatus having means for evaluating a high voltage waveform and disclosing the presence of high frequency transients.

SUMMARY OF THE INVENTION

Accordingly, this invention provides a frequency compensated voltage divider network comprising capacitive voltage divider means connected in parallel with resistive voltage divider means. The capacitive means includes a coaxial array of spaced capacitive plates having respective adjacent surfaces disposed in predetermined spaced relationship for providing substantially uniform electrostatic fields therebetween. The resistive means includes a plurality of resistive elements connected in electrical series, each resistive element being connected between a respective pair of the capacitive plates and some of the resistive elements being disposed entirely between adjacent surfaces of the associated capacitive plates. End terminal portions of the array are disposed for electrical connection to relatively high and low potential sources, respectively; and a portion of the array therebetween is connected to a voltage sensing tap. Thus, the resistive elements provide respective voltage drops whereby a graduated series of voltage values is provided along the array between the high and low potential sources. The capacitive plates provide means for bypassing high frequency transient signals around the associative interposed resistive elements thereby off-setting the effects of stray capacitance. Also, by having the resistive elements disposed in the substantially uniform gradient fields between the capacitive plates, they are subjected to less field stress and are shielded from corona discharge to adjacent conductive members of relatively lower potential.

A preferred embodiment comprises the frequency compensated, voltage divider of this invention insulatingly disposed within a conductive housing filled with a dielectric fluid, such a sulfur hexafluoride gas, for example. The housing is provided with suitable terminal means for connecting the voltage divider between the cathode and anode electrodes of an X-ray tube. The voltage divider includes a coaxial array of spaced capacitive plates connected to one another by respective resistive elements disposed between the plates. One end plate of the array is connected to the cathode of the X-ray tube; and the opposing end plate of the array is connected to the anode. A plate centrally located in the array is connected to the housing which is connected to the electrical ground. The resistive elements on either side of the grounded capacitive plate are adjustable; and the capacitive plates on either side thereof are connected to respective conductive taps. Thus the conductive taps provide means for obtaining proportionate readings of the cathode and anode voltages, respectively.

The cathode and anode portions of the array may be disposed in spaced insulating relationship within respective concentric conductive shields which are connected to the associated conductive taps. Thus, the concentric conductive shields provide additional capacitive means for counteracting the effects of stray capacitance to increase the frequency response of the voltage divider correspondingly. The conductive taps and the centrally located capacitive plate of the voltage divider may be connected to suitable signal processing and display means, such as respective amplifiers and oscilloscopes, for examples, whereby the anode and cathode of voltage waveforms and the transient components thereof may be evaluated.

BRIEF DESCRIPTION OF THE DRAWINGS

For a better understanding of the invention, reference is made in the following more detailed description to the accompanying drawings wherein.

DESCRIPTION OF THE PREFERRED EMBODIMENT

Figure 1:
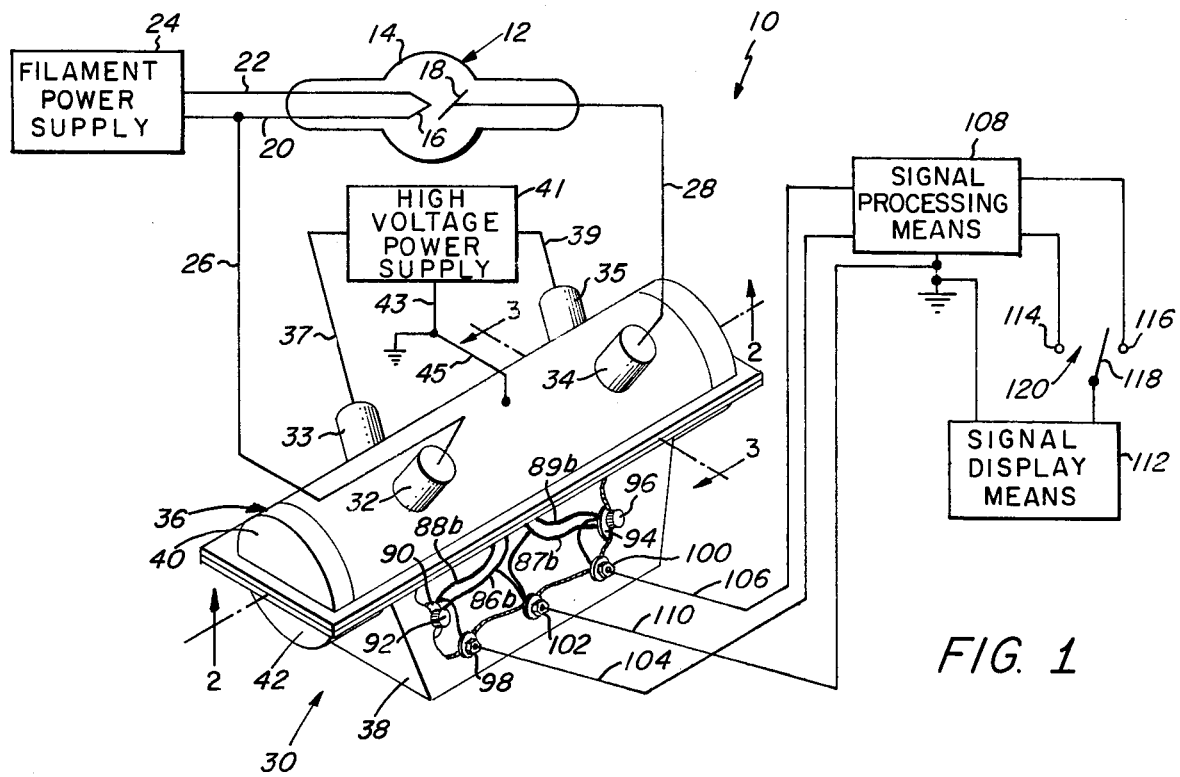
FIG. 1 shows an X-ray system including voltage monitoring apparatus embodying the invention.

Referring to the drawings wherein like characters of reference designate like parts, there is shown in FIG. 1 an X-ray generator monitoring system 10 including an X-ray tube 12 having an evacuated envelope 14. Within envelope 14, a cathode 16 is disposed to direct a beam of emitted electrons onto a spaced anode 18. The cathode 16 is provided with a pair of externally extending leads 20 and 22, respectively, which are connected to respective terminals of a filament power supply 24. One of the cathode leads, such as 20, for example, and the anode 16 of X-ray tube 12 are connected through respective conductors 26 and 28 to respective terminal connectors 32 and 34 of a voltage sensing means 30.

Voltage sensing means 30 includes a hollow cylindrical housing 36 longitudinally disposed and affixed to a hollow base portion 38, both of which are made of rigid conductive material, such as aluminum, for example. Housing 36 comprises a flanged pair of half-cylindrical shells, 40 and 42, respectively, which are hermetically attached to one another in a conventional gas-tight manner, as by means of an interposed gasket (not shown) and a plurality of spaced bolts (not shown), for example. The upper shell 40, as viewed in FIG. 1, constitutes a demountable cover of housing 36 and has hermetically secured therein the respective connectors 32 and 34 and associated spaced connectors 33 and 35, respectively, which provide electrical communication with components within the housing 36. Each of the connectors 32–35 comprises a suitable gas-tight type of connector, such as U.S. Federal Standard Connector No. 72 made by Machlett Laboratories, Inc., of Stamford, Connecticut, for example, having a conductive terminal member extending longitudinally through a cylindrical dielectric body. The housing 36 also is provided with conventional port means (not shown) for filling the housing with a dielectric fluid, such as sulfur hexafluoride gas, for example.

Figure 2:
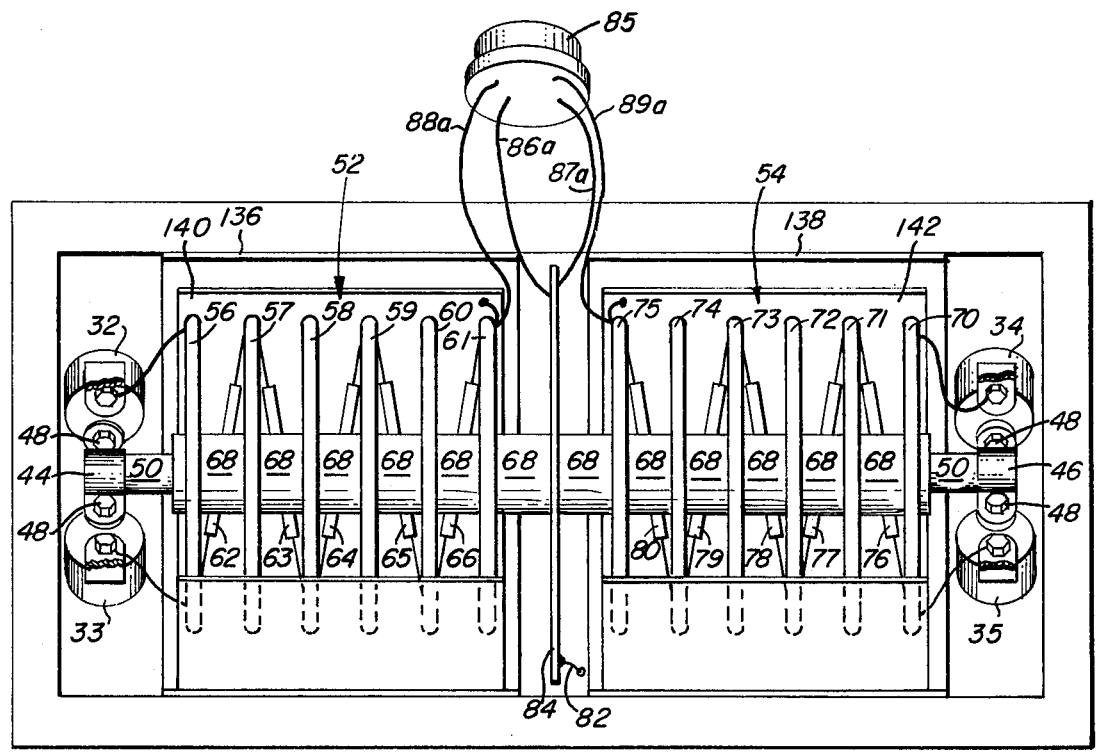
FIG. 2 is a sectional view taken along line 2—2 shown in FIG. 1 and looking in the direction of the arrows.

As shown in FIG. 2, respective clamps 44 and 46 are suitably secured, as by bolts 48, for example, to adjacent dielectric portions of the connectors 32–35 and support respective end portions of a dielectric rod 50. The rod 50 may be made of polycarbonate material, for example, and extends longitudinally within the housing 36. Axially spaced apart on the rod 50 is a pair of voltage divider networks 52 and 54, respectively, which are insulatingly spaced from the encircling walls of housing 36. The voltage divider network 52 comprises a coaxial array of spaced capacitive plates 56–61 which are connected in electrical series by respective resistive elements 62–66 disposed between the plates. Similarly, the voltage network 54 comprises a coaxial array of spaced capacitive plates 70–75 which are connected in electrical series by respective resistive elements 76–80 disposed between the plates. Adjacent capacitive plates of the voltage divider networks 52 and 54, respectively, are spaced predetermined fixed distances apart by interposed dielectric sleeves 68 which encircle the rod 50 and may be made of polycarbonate material, for example.

Each one of the respective capacitive plates 56–61 and 70–75 is made of rigid conductive material, such as aluminum, for example, and may comprise a substantially circular disc having a relatively large diameter, such as four inches, for example. Also, the capacitive plates 56–61 and 70–75 are provided with respective rounded peripheral edges to avoid a concentration of high electric fields adjacent the encircling walls of housing 36. The resistive elements 62–66 and 76–80, respectively, may be of the metal oxide film type, such as MOX Model 1125 by Victoreen Instruments Division of VLN, Cleveland, Ohio, or example. Each of the resistive elements 62–66 and 76–80 may comprise one or more resistors connected in electrical series between adjacent capacitive plates of the associated voltage divider networks 52 and 54, respectively. Since a resistor is rated electrically with required lengths of opposing leads, it may be preferable to connect the resistive elements 62–66 and 76–80 diagonally between the adjacent capacitive plates of the voltage divider networks 52 and 54, respectively, as shown in FIG. 2.

The conductive terminal of connector 32 is connected through the end capacitive plate 56 of voltage divider network 52 to the conductive terminal of connector 33. Similarly, the conductive terminal of connector 34 is connected through the end capacitive plate 70 to the conductive terminal of connector 35. The conductive terminals of connectors 33 and 35 are connected externally of housing 36 to respective conductors 37 and 39 which are connected to the negative and positive terminals respectively of a polarized source 41 of high voltage. Thus, the negative and positive terminals of high voltage source 41 are connected electrically to the cathode and anode electrodes, respectively, of the X-ray tube 12. A third terminal of high voltage source 41 is connected, as indicated schematically, to electrical ground through a conductor 43. Accordingly, a high positive voltage, such as 75 kilovolts, for example, with respect to electrical ground is applied to the anode of X-ray tube 12. Similarly, a high magnitude negative voltage, such as 75 kilovolts, for example, with respect to electrical ground is applied to the cathode of X-ray tube 12.

Figure 3:
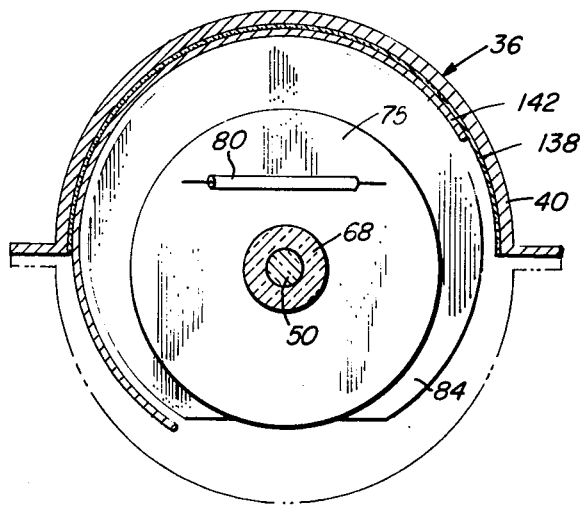
FIG. 3 is a transverse sectional view taken along line 3—3 shown in FIG. 1 and looking in the direction of the arrows.

The housing 36 of voltage sensing means 30 is connected, as indicated schematically, through a conductor 45 to electrical ground. Also, the inner surface of housing 36 is connected through a conductor 82 to a capacitive plate 84 which is supported on a central portion of the rod 50. This grounded capacitive plate 84, as shown in FIG. 3, is provided with relatively large flat surface areas as compared to the capacitive plates 56–61 and 70–75, respectively. A chordal portion of the grounded capacitive plate 84 may be removed to avoid interference with a gas-tight connector receptacle (not shown) which is disposed in the wall of lower shell 42 and provides electrical connection with the interior of base portion 38. Opposing surfaces of the grounded capacitive plate 84 are connected through respective conductors $86_a$ and $87_a$ to associated terminal pins of a plug-type connector 85 which mates with the connector receptacle in the wall of lower shell 42. Also, the adjacent surfaces of capacitive plates 61 and 75 are connected through respective conductors $88_a$ and $89_a$ to associated terminal pins of the plug-type connector 85. Accordingly, the conductors $86_a - 89_a$ are connected electrically to respective conductors $86_b - 89_b$ in the interior of base portion 38.

Within base portion 38, the conductors $86_b$ and $88_b$ are connected to respective terminals of an adjustable resistive element 90 having an external adjustment knob 92. Similarly, the conductors $87_b$ and $89_b$ are connected to respective terminals of an adjustable resistive element 94 having an external adjustable knob 96. Thus, the adjustable resistive elements 90 and 94 are connected in electrical series between capacitive plates 61 and 75, respectively and the grounded capacitive plate 84. Alternatively, the adjustable resistive element 90 and 94 may be disposed in the housing 32 between the grounded capacitive plate 84 and the capacitive plates 61 and 75, respectively, in a manner similar to resistive elements 62–66 and 76–80, respectively. The conductors $88_b$ and $89_b$ are also connected to respective low voltage jacks 98 and 100, respectively, which provide electrical communication with the interior of base portion 38. Also, the respective conductors $86_b$ and $87_b$ are connected to a similar externally communicating jack 102.

The jacks 98 and 100 are connected through conductors 104 and 106, respectively, to respective input terminals of a signal processing means 108. The jack 102 is connected through a conductor 110 to grounded terminals of the signal processing means 108 and a display means 112 respectively. The signal processing means 108, which may comprise conventional buffer amplifier means, for example, has respective output terminals connected to contacts 114 and 116, respectively, of an electrical switch means 120. A movable arm 118 of the switch means 120 may be moved into electrical communication with the contact 114 or the contact 116. Movable arm 118 of switch means 120 is connected to an input terminal of display means 112 such as an oscilloscope, for example, whereby the cathode or the anode voltage waveforms may be viewed visually.

Figure 4:
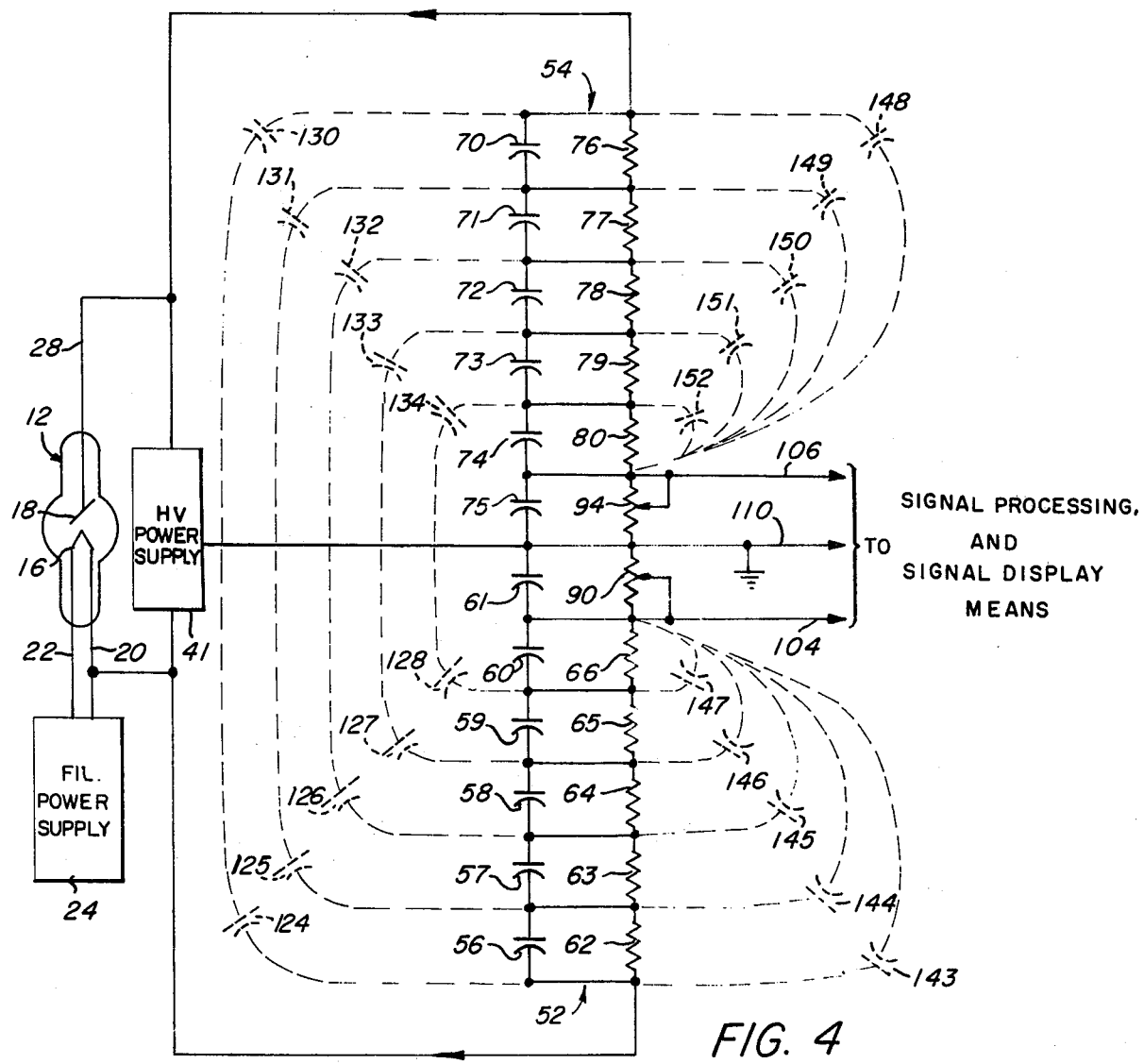
FIG. 4 is a schematic view of the voltage monitoring apparatus shown in FIG. 1.

As shown in FIG. 4 the voltage sensing means 30 includes voltage divider networks 52 and 54 connected between the cathode and anode electrodes, respectively, and electrical ground. Voltage divider network 52 includes a resistive voltage divider means comprising series connected resistive elements 62–66 and adjustable resistive element 90 for providing respective voltage drops whereby a graduated series of intermediate voltage values is established between the cathode 16 and electrical ground. Similarly, voltage divider network 54 includes a resistive voltage divider means comprising series connected resistive elements 76–80 and adjustable resistive element 94 for providing respective voltage drops whereby a graduated series of intermediate voltage values is established between the anode 18 and electrical ground.

Each of the resistive elements 76–80, for example, may have respective resistive values of two hundred megohms and the adjustable resistive element may have a value of 100K ohms. Thus, the total resistive value of the series connected resistors 76–80 may be about 1000 megohms, for a ratio of 10,000 to one, in comparison with the ohmic value of adjustable resistive element 94. Accordingly, when a voltage of 75 kilovolts, for example, is applied to the anode 18 of X-ray tube 12, a proportionately lower voltage value of about seven and a half volts, for example will be applied across the adjustable resistive element 94. Since the adjustable resistor 94 is not subjected to the relatively high voltage values applied to the resistors 76–80, it need not be disposed between the capacitive plates 56–61 of voltage divider network 54.

However, by disposing the high voltage portion of the resistive voltage divider means between the capacitive plates 70–75, the resistive elements 76–80 are disposed in uniform gradient fields of relatively lower value. Thus, when a voltage of 75 kilovolts is applied to the anode 18, the resistive element 76 is disposed in a uniform gradient field having a potential drop of about 15,000 volts instead of being subjected to the potential drop of 75 kilovolts with respect to the grounded housing 36. A similar reasoning applies to disposing the adjustable resistor 90 in base portion 38 and disposing the resistors 62–66 between the capacitive plates 56–61 of voltage divider network 52.

Because of the necessarily long lengths of the resistive voltage divider means and the high voltages involved, stray capacitance is established between electrical ground and the series connected resistive elements in the high voltage portions of the resistive voltage divider means. This stray capacitance is indicated by the respective parallel arrays of capacitors 124–128 and 130–134 connected between the high voltage portions of voltage divider networks 52 and 54, respectively, and electrical ground. Since stray capacitance limits frequency response of the resistive voltage divider means, the voltage divider networks 52 and 54 are provided with respective capacitive voltage dividers. Thus, the voltage divider network 52 includes capacitive voltage divider means connected in parallel with the associated resistive voltage divider means and comprising series connected capacitors 56–61, respectively. Similarly, the voltage divider network 54 includes capacitive voltage divider means connected in parallel with the associated resistive voltage divider means and comprising series connected capacitors 70–75, respectively. The respective capacitors 56–61 and 70–75 provide means for bypassing high frequency transient components of the voltage signals around the associated resistive elements and thereby minimizing the effects of stray capacitance. As a result, the frequency response characteristics of the respective voltage divider networks are greatly enhanced.

However, if the respective capacitance voltage divider means are not sufficient to reduce the effects of stray capacitance to the extent desired, additional high frequency bypass means may be provided. As shown in FIGS. 2 and 3, the inner surface portions of housing 36 encircling the voltage divider networks 52 and 54 may be lined with respective films 136 and 138 of dielectric material, such as polyvinylchloride, for example, which is bonded to the inner surface of housing 36 by suitable means, such as epoxy based adhesive, for example. Similarly bonded to the inner surfaces of the films 136 and 138 are respective arcuate shields, 140 and 142, respectively, made of thin conductive material, such as aluminum sheet stock, for example. The shields 140 and 142 are spaced from the capacitive arrays of voltage divider networks 52 and 54, respectively, and are electrically connected to respective capacitive plates 61 and 75. Shields 140 and 142 are provided with sufficient arcuate lengths to provide the additional capacitance required for counteracting the stray capacitance. The additional capacitance provided by shields 140 and 142 is indicated in FIG. 4 by the respective parallel arrays of capacitors 143–147 and 148–152 which are connected between the cathode and anode, respectively, and the associated capacitive plates 61 and 75, respectively. As a result of the additional capacitance provided by the shields 140 and 142, respectively, the frequency response characteristics may be extended to include frequencies of 100 kilohertz, for example. Also, the capacitive values of the plates 56–61 and 70–75, respectively, may be increased to provide additional capacitance by disposing an insulating material having a higher dielectric constant than sulfur hexafluoride between the plates, such as glass having a dielectric constant of eight, for example.

Thus, there has been disclosed herein a voltage monitoring apparatus including voltage sensing means comprised of a coaxial array of spaced parallel capacitive plates connected to one another by respective resistive elements, at least one of which is disposed entirely between the adjacent surfaces of the associated capacitive plates to which it is connected.

From the foregoing, it will be apparent that all of the objectives of this invention have been achieved by the structures and circuits shown and described. It also will be apparent, however, that various changes may be made by those skilled in the art without departing from the spirit of the invention as expresed in the appended claims. It is to be understood, therefore, that all matter shown and described herein is to be interpreted as illustrative and not in a limiting sense.

What is claimed is:

1. Voltage monitoring apparatus comprising:
   capacitance means including a coaxial array of capacitive plates having respective adjacent surfaces disposed in predetermined spaced relationship for providing electrostatic fields therebetween; and
   resistance means attached electrically to the capacitive plates for providing voltage drops therebetween, the resistance means including at least one resistive element disposed entirely between respective adjacent surfaces of the capacitive plates and in direct electrical contact therewith.

2. Voltage monitoring apparatus as set forth in claim 1 wherein the capacitance means includes at least three capacitive plates, and the resistance means includes at least two resistive elements, one of which is disposed exterior of the coaxial array.

3. Voltage monitoring apparatus as set forth in claim 2 wherein the exterior resistive element is adjustable and has a lower ohmic value than the resistive element disposed between adjacent surfaces of the capacitive plates.

4. Voltage monitoring apparatus as set forth in claim 1 wherein the capacitance means also includes a conductive shield disposed adjacent the capacitive plates and spaced therefrom, the shield being electrically attached to one of the plates of the array.

5. Voltage monitoring apparatus as set forth in claim 4 wherein the capacitive plates comprise circular discs and the shield is disposed in spaced arcuate relationship with the respective peripheries of the plates.

6. Voltage monitoring apparatus as set forth in claim 1 wherein an insulating medium having a dielectric constant greater than one is disposed between the adjacent surfaces of the capacitive plates.

7. Voltage monitoring apparatus comprising:
   a hollow housing having first and second insulated connector terminals disposed in electrical communication with the interior of the housing;
   a coaxial array of spaced capacitive plates disposed within the housing, one end portion of the array being connected electrically to the first connector terminal and an opposing end portion of the array being connected electrically to the second connector terminal;
   a plurality of resistive elements, each of which is disposed in electrical contact with respective adjacent plates of the array and at least one of which is disposed entirely between the associated adjacent plates of the array.

8. Voltage monitoring apparatus as set forth in claim 7 wherein the second connector terminal is disposed for connection to a source of electrical potential and the first connector terminal is disposed for connection to a source of relatively higher electrical potential.

9. Voltage monitoring apparatus as set forth in claim 8 wherein the resistive elements disposed in electrical contact with the capacitive plates in said one end portion of the array are disposed entirely between the associated capacitive plates.

10. Voltage monitoring apparatus as set forth in claim 7 wherein an intermediate portion of the array is connected to conductive tap means for sensing an intermediate value of electrical potential.

* * * * *